(12) United States Patent
Sung et al.

(10) Patent No.: US 9,012,891 B2
(45) Date of Patent: Apr. 21, 2015

(54) HYBRID ORGANIC-INORGANIC THIN FILM AND PRODUCING METHOD OF THE SAME

(75) Inventors: Myung Mo Sung, Seoul (KR); Sang Ho Cho, Seoul (KR); Ki Bok Han, Seoul (KR); Kyu Seok Han, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 13/401,355

(22) Filed: Feb. 21, 2012

(65) Prior Publication Data

US 2013/0026455 A1    Jan. 31, 2013

(30) Foreign Application Priority Data

Jul. 28, 2011 (KR) .......... 10-2011-0075168
Feb. 20, 2012 (KR) .......... 10-2012-0016991

(51) Int. Cl.
*H01L 29/08* (2006.01)
*H01L 35/24* (2006.01)
*H01L 51/00* (2006.01)
*H01L 51/05* (2006.01)

(52) U.S. Cl.
CPC ........ *H01L 51/0562* (2013.01); *H01L 51/0003* (2013.01)

(58) Field of Classification Search
CPC .......... H01L 51/0562; H01L 51/0003
USPC ........ 257/14, 749; 438/99, 790; 428/213, 690
See application file for complete search history.

(56) References Cited

U.S. PATENT DOCUMENTS

| | | | |
|---|---|---|---|
| 5,882,548 A * | 3/1999 | Liang et al. .............. | 252/301.16 |
| 7,439,096 B2 * | 10/2008 | Baldwin et al. ................. | 438/99 |
| 2003/0096902 A1 * | 5/2003 | Takeoka et al. ............... | 524/534 |
| 2008/0017854 A1 * | 1/2008 | Marks et al. ..................... | 257/43 |
| 2008/0248281 A1 * | 10/2008 | Nakaguma et al. ........ | 428/312.8 |
| 2009/0137043 A1 * | 5/2009 | Parsons et al. ................ | 435/398 |
| 2010/0178481 A1 * | 7/2010 | George et al. ................. | 428/213 |
| 2010/0296127 A1 * | 11/2010 | Barndt et al. ................ | 358/3.24 |
| 2011/0207039 A1 * | 8/2011 | Yamada et al. ................. | 430/56 |

FOREIGN PATENT DOCUMENTS

| CN | 101532240 | * | 9/2009 |
|---|---|---|---|
| KR | 10-2010-0004261 | | 1/2010 |
| KR | 1020100074375 | | 7/2010 |

OTHER PUBLICATIONS

High Performance Two Dimensional Polydiacetylene with a Hybrid Inorganic Organic Structure, Sangho et al., Feb. 21, 2011.*
Sangho et al [High Performance Two Dimensional Polydiacetylene with a Hybrid Inorganic Organic Structure; Published Feb. 21, 2011].*
Sangho Cho, et al., "High-Performance Two-Dimensional Polydiacetylene with a Hybrid Inorganic-Organic Structure," Angew. Chem. Int. Ed., 2011, pp. 2742-2746, vol. 50.

* cited by examiner

*Primary Examiner* — Ha Tran T Nguyen
*Assistant Examiner* — Ismail Muse
(74) *Attorney, Agent, or Firm* — Greer Burns & Crain Ltd.

(57) ABSTRACT

The present disclosure relates to a hybrid organic-inorganic thin film producing method including an interlayer connection between an inorganic cross-linked layer and an organic polymer through a molecular layer deposition (MLD) method, a hybrid organic-inorganic thin film produced by the producing method, and an organic electronic device and a thin film transistor containing the hybrid organic-inorganic thin film.

8 Claims, 13 Drawing Sheets

HYBRID ORGANIC-INORGANIC THIN FILM AND PRODUCING METHOD OF THE SAME

CROSS-REFERENCE TO RELATED APPLICATION

This application claims the benefit of Korean Patent Application No. 10-2011-0075168 filed on Jul. 28, 2011, and Korean Patent Application No. 10-2012-0016991 filed on Feb. 20, 2012, the entire disclosures of which are incorporated herein by reference.

FIELD OF THE INVENTION

The present disclosure relates to a hybrid organic-inorganic thin film producing method including an interlayer connection between an inorganic cross-linked layer and an organic polymer through a molecular layer deposition (MLD) method, a hybrid organic-inorganic thin film produced by the producing method, and an organic electronic device and a thin film transistor containing the hybrid organic-inorganic thin film.

BACKGROUND OF THE INVENTION

Many materials used in organic electronic devices are conjugated organic polymers with a backbone of alternating double and single bonds along which electrons can flow. Owing to their structural flexibility and tunable electronic properties, conductive polymers are flexible and inexpensive and show great promise in large-area applications such as flexible displays, radio frequency identification devices (RFIDs), smart cards, nonvolatile memories, and sensors. These polymers have a one-dimensional nature. Thin films of conjugated polymers have disordered structures with twists and bends in their individual polymer strands. For most applications, a challenge is to uniformly align polymer chains to control efficiency with which light and electrons can be transported by polymer molecules. Korean Registered Patent No. 10-0957528 describes a producing method of a hybrid organic-inorganic composite material cross-linked by using a small amount of inorganic oxide particles and a silicon-based cross-linked polymer precursor.

DISCLOSURE OF THE INVENTION

Problems to be Solved by the Invention

To solve the problem, the present inventors find that greater control of the alignment, stability, and electronic properties of organic polymer chains can be made by incorporating stable inorganic cross-linked layers into a conjugated organic polymer and achieve the present disclosure based on the findings.

The present disclosure provides a hybrid organic-inorganic thin film producing method including an interlayer connection between an inorganic cross-linked layer and an organic polymer through a molecular layer deposition (MLD) method, a hybrid organic-inorganic thin film produced by the producing method, an organic electronic device and a thin film transistor containing the hybrid organic-inorganic thin film.

However, the problems to be solved by the present disclosure are not limited to the above description and other problems can be clearly understood by those skilled in the art from the following description.

Means for Solving the Problems

In accordance with a first aspect of the present disclosure, there is provided a hybrid organic-inorganic thin film producing method including an interlayer connection between an inorganic cross-linked layer and an organic polymer through a molecular layer deposition (MLD) method.

In accordance with a second aspect of the present disclosure, there is provided a hybrid organic-inorganic thin film produced by the hybrid organic-inorganic thin film producing method in accordance with the first aspect of the present disclosure.

In accordance with a third aspect of the present disclosure, there is provided an organic electronic device containing the hybrid organic-inorganic thin film in accordance with the second aspect of the present disclosure.

In accordance with a fourth aspect of the present disclosure, there is provided a thin film transistor including a substrate, a semiconductor channel including a hybrid organic-inorganic thin film, in accordance with the second aspect of the present disclosure, formed on the substrate, and source/drain electrodes provided on the semiconductor channel.

Effect of the Invention

A hybrid organic-inorganic thin film produced by a producing method of a hybrid organic-inorganic thin film including an interlayer connection between an inorganic cross-linked layer and an organic polymer through a molecular layer deposition (MLD) method can form a two-dimensional hybrid organic-inorganic thin film by bonding inorganic cross-linked layers to conjugated organic polymer layers. The inorganic layers of the hybrid organic-inorganic thin film constitute an extended structure bonded by powerful covalent interactions resulting in high carrier mobility as well as good thermal and mechanical stabilities. The advantages of the MLD method employed in the present disclosure include accurate control of film thickness, large-scale uniformity, excellent conformality, good reproducibility, and sharp interfaces. The hybrid organic-inorganic thin film of the present disclosure exhibits good thermal and mechanical stabilities and excellent field effect mobility ($>1.3\ cm^2V^{-1}s$). The MLD method is an ideal technique for fabrication of various hybrid organic-inorganic thin film with inorganic cross-linked layers and can be applied to fabrication of organic polymer-inorganic hybrid superlattices.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
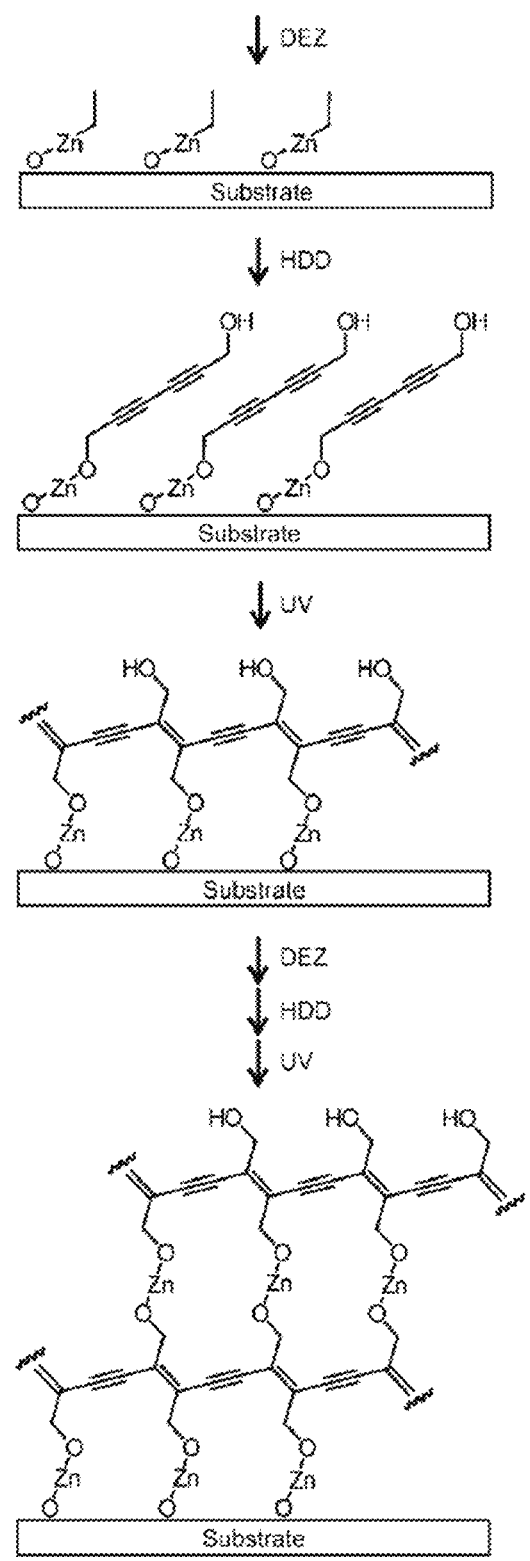
FIG. 1 is a schematic view illustrating a process of an interlayer connection between an inorganic cross-linked layer and an organic polymer through a molecular layer deposition method in accordance with an embodiment of the present disclosure.

Hereinafter, embodiments and examples of the present disclosure will be described in detail with reference to the accompanying drawings so that the present disclosure may be readily implemented by those skilled in the art.

However, it is to be noted that the present disclosure is not limited to the embodiments and examples but can be realized in various other ways.

Through the whole document, the terms "comprises or includes" and/or "comprising or including" used in the document means that one or more other components, steps, operation and/or existence or addition of elements are not excluded in addition to the described components, steps, operation and/or elements unless context dictates otherwise. The terms "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the terms "step of" does not mean "step for".

Through the whole document, the terms "on" that is used to designate a position of one element with respect to another element includes both a case that the one element is adjacent to the another element and a case that any other element exists between these two elements.

In accordance with a first aspect of the present disclosure, there is provided a hybrid organic-inorganic thin film producing method of including an interlayer connection between an inorganic cross-linked layer and an organic polymer through a molecular layer deposition (MLD) method.

In accordance with an embodiment of the present disclosure, the hybrid organic-inorganic thin film producing method includes, but not limited to, performing, one or more times, a process cycle including: bonding an inorganic cross-linked layer onto a substrate within a MLD chamber; and bonding hexadiyne diol (HDD) to the inorganic cross-linked layer bonded onto the substrate and performing UV polymerization thereto.

The MLD method is a gas-phase layer-by-layer growth process, analogous to atomic layer deposition (ALD) method. The MLD method relies on sequential saturated surface reactions and results in formation of an organic monolayer in each sequence. In accordance with an embodiment of the present disclosure, through the MLD method, conjugated organic polymer layers are bonded to inorganic cross-linked layers to produce 2D polydiacetylenes. The inorganic layers constitute an extended structure bonded by powerful covalent interactions resulting in high carrier mobility as well as good thermal and mechanical stabilities. The advantages of the MLD method include accurate control of film thickness at low temperatures, large-scale uniformity, excellent conformality, good reproducibility, multilayer processing capability, sharp interfaces, and excellent film qualities at low temperatures. By way of example, 2D polydiacetylene thin films can be formed with monolayer precision by ligand-exchange reactions of an inorganic cross-linked layer and hexadiyne diol (HDD) with UV polymerization, whereby OH groups on both ends of the diol sequentially react with the inorganic cross-linked layer to produce bridging alkanes. Inorganic oxide cross-linked polydiacetylene thin films may have enhanced carrier mobility or other favorable properties owing to their 2D structures.

Figure 2:
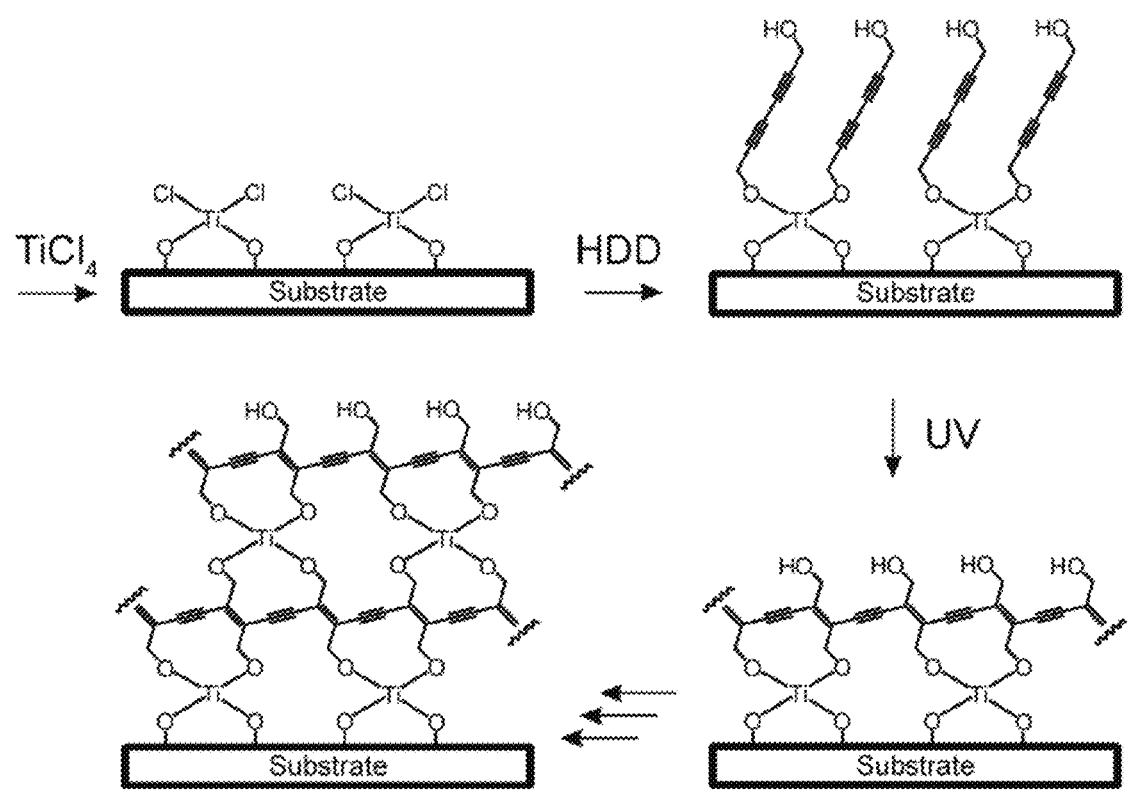
FIG. 2 is a schematic view illustrating a process of an interlayer connection between an inorganic cross-linked layer and an organic polymer through a molecular layer deposition method in accordance with an embodiment of the present disclosure.

Referring to FIGS. 1 and 2, a hybrid organic-inorganic thin film producing method in accordance with an embodiment of the present disclosure will be explained.

FIG. 1 is a schematic view illustrating a procedure of producing a zinc oxide cross-linked polydiacetylene (ZnOPDA) film by using diethylzinc (DEZ) as an inorganic cross-linked layer. In a MLD chamber, an ethyl zinc monolayer is formed by exposing a substrate to the DEZ molecule. The DEZ molecule is chemisorbed on a substrate surface rich in hydroxy groups through a ligand-exchange reaction to form $C_2H_5ZnO$ species. Then, an ethyl group of the chemisorbed ethyl zinc molecule on the substrate is replaced by an OH group of HDD with living ethane to form a diacetylene layer. The OH group of the diacetylene layer provides an active site for an exchange reaction of the next DEZ molecule. Thereafter, diacetylene molecules are polymerized by UV irradiation to form a polydiacetylene layer. Zinc oxide cross-linked polydiacetylene (ZnOPDA) thin films are grown under vacuum by repeated sequential adsorptions of DEZ and HDD with UV polymerization. An expected monolayer thickness for an ideal model structure of ZnOPDA is, but not limited to, about 6 Å.

FIG. 2 is a schematic view illustrating a procedure of producing a titanium oxide cross-linked polydiacetylene (TiOPDA) film by using $TiCl_4$ as an inorganic cross-linked layer. In a MLD chamber, a titanium dichloride oxide monolayer is formed by exposing a substrate to the $TiCl_4$ molecule. The $TiCl_4$ molecule is chemisorbed on a substrate surface rich in hydroxy groups through a ligand-exchange reaction. Then, a chloride group of the chemisorbed titanium dichloride molecule on the substrate is replaced by an OH group of HDD with living ethane to form a diacetylene layer. The OH group of the diacetylene layer provides an active site for an exchange reaction of the next $TiCl_4$ molecule. Thereafter, diacetylene molecules are polymerized by UV irradiation to form a polydiacetylene layer. Titanium oxide cross-linked polydiacetylene (TiOPDA) thin films are grown under vacuum by repeated sequential adsorptions of $TiCl_4$ and HDD with UV polymerization.

In accordance with an embodiment of the present disclosure, there is no limit to the organic polymer if it is an initiator-free photopolymeric polymer that does not contain an initiator for initiating polymerization. By way of example, the organic polymer may be, but not limited to, polydiacetylene or vinyl ether-aleimide.

In accordance with an embodiment of the present disclosure, the inorganic cross-linked layer may contain an oxide of metal selected from a group including, but not limited to, Zn, Al, Ti, Zr, Sn, Mn, Fe, Ni, Mo, and combinations thereof. The inorganic cross-linked layer provides greater control of alignment, stability, and electronic properties of organic polymer chains to form hybrid organic-inorganic structure materials. Hybrid organic-inorganic conductive polymers are ideal materials for organic electronic devices since they offer the structural flexibility and tunable optoelectronic properties of their organic components in addition to the stable and excellent electrical properties of their inorganic components.

In accordance with an embodiment of the present disclosure, the hybrid organic-inorganic thin film may have, but is not limited to, a two-dimensional structure.

In accordance with an embodiment of the present disclosure, when the hexadiyne diol (HDD) is bonded to the inorganic cross-linked layer bonded onto the substrate, the hybrid organic-inorganic thin film producing method may include, but is not limited to, a self-terminating reaction. In the MLD method, desirably, the surface reaction for HDD is self-terminating and complementary to yield a uniform, conformal, and high-quality polydiacetylene thin film.

In accordance with an embodiment of the present disclosure, the hybrid organic-inorganic thin film producing method may further include, but is not limited to, a purging process after the inorganic cross-linked layer is bonded onto the substrate.

In accordance with an embodiment of the present disclosure, the hybrid organic-inorganic thin film producing method may further include, but is not limited to, a purging process after the hexadiyne diol (HDD) is bonded to the inorganic cross-linked layer bonded onto the substrate.

In accordance with an embodiment of the present disclosure, the purging process uses a purge gas including, but not limited to, argon (Ar), nitrogen ($N_2$), and helium (He).

In accordance with a second aspect of the present disclosure, there is provided a hybrid organic-inorganic thin film produced by the hybrid organic-inorganic thin film producing method in accordance with the first aspect of the present disclosure.

In accordance with an embodiment of the present disclosure, the hybrid organic-inorganic thin film may have, but is not limited to, a two-dimensional structure.

In accordance with a third aspect of the present disclosure, there is provided an organic electronic device containing the hybrid organic-inorganic thin film in accordance with the second aspect of the present disclosure.

In accordance with a fourth aspect of the present disclosure, there is provided a thin film transistor including a substrate, a semiconductor channel including a hybrid organic-inorganic thin film, in accordance with the second aspect of the present disclosure, formed on the substrate, and source/drain electrodes provided on the semiconductor channel.

In accordance with an embodiment of the present disclosure, the thin film transistor may have a field effect mobility in a range of, but not limited to, from about $1.2\ cm^2V^{-1}s$ to about $1.7\ cm^2V^{-1}s$.

Hereinafter, the present disclosure will be explained in detail with reference to the following examples. However, the present disclosure is not limited thereto.

EXAMPLES

Materials

Unless otherwise noted, all commercial materials were obtained from Aldrich Chemical Co. and used without further purification. 2,4-Hexadiyne-1,6-diol (HDD) was obtained from Tokyo Chemical Industry and used as received. Deionized water was purified with a Millipore Milli Q plus system, distilled over $KMnO_4$, and then passed through a Millipore Simplicity system.

Example 1

Preparation of Substrates

Si substrates were cut from p-type (100) wafers (LG Siltron) with resistivities in a range of from about 1 Ωm to about 5 Ωm. The Si substrates were initially treated by a chemical cleaning process proposed by Ishizaka and Shiraki (A. Ishizaka, Y. Shiraki, J. Electrochem. Soc. 1986, 133, 666-671). The chemical cleaning process includes degreasing, boiling in $HNO_3$, boiling in $NH_3/H_2O$ (alkali treatment) boiling in HCl (acid treatment), rinsing in deionized water, and blow-drying with nitrogen to remove contaminants and grow a thin protective oxide layer on their surfaces.

Molecular Layer Deposition

The oxidized Si(100) substrates were introduced into a Cyclic 4000 MLD system (Genitech, Taejon, Korea). Zinc oxide cross-linked polydiacetylene (ZnOPDA) thin films were deposited onto the substrate using DEZ and HDD as precursors. Argon served as both a carrier and a purge gas. DEZ and HDD were evaporated at about 20° C. and about 80° C., respectively. A cycle was made up of exposure to DEZ for about 2 seconds, purging with Ar for about 10 seconds, exposure to HDD for about 10 seconds, and purging with Ar for about 50 seconds. A total flow rate of Ar was about 50 sccm. The deposited HDD layer was exposed to UV light ($\lambda$=254 nm, 100 W) for about 30 seconds. The ZnOPDA films were grown at temperatures of about 100° C. to about 150° C. under a pressure of about 300 mTorr.

Example 2

Preparation of Substrates

Si substrates were cut from p-type (100) wafers (LG Siltron) with resistivities in a range of from about 1 Ωm to about 5 Ωm. The Si substrates were initially treated by a chemical cleaning process proposed by Ishizaka and Shiraki (A. Ishizaka, Y. Shiraki, J. Electrochem. Soc. 1986, 133, 666-671). The chemical cleaning process includes degreasing, boiling in $HNO_3$, boiling in $NH_3/H_2O$ (alkali treatment), boiling in HCl (acid treatment), rinsing in deionized water, and blow-drying with nitrogen to remove contaminants and grow a thin protective oxide layer on their surfaces.

Molecular Layer Deposition

The oxidized Si(100) substrates were introduced into a Cyclic 4000 MLD system (Genitech, Taejon, Korea). Titanium oxide cross-linked polydiacetylene (TiOPDA) thin films were deposited onto the substrate using $TiCl_4$ and HDD as precursors. Argon served as both a carrier and a purge gas. $TiCl_4$ and HDD were evaporated at about 20° C. and about 80° C., respectively. A cycle was made up of exposure to $TiCl_4$ for about 2 seconds, purging with Ar for about 10 seconds, exposure to HDD for about 10 seconds, and purging with Ar for about 50 seconds. A total flow rate of Ar was about 50 sccm. The deposited HDD layer was exposed to UV light (λ=254 nm, 100 W) for about 30 seconds. The TiOPDA films were grown at temperatures of about 100° C. to about 150° C. under a pressure of about 300 mTorr.

Experimental Example 1

Study on Characteristic of ZnOPDA Films of Example 1

Raman spectra of ZnOPDA films produced as described above in Example 1 were obtained by using a Raman spectrometer system (Renishaw Model 2000) equipped with an integral microscope (Olympus BH2-UMA). 514.5 nm line from a 20 mW air-cooled Ar$^+$ laser (Melles-Griot Model 351MA520) was used as an excitation source. Raman scattering was detected with 180° geometry using a Peltier-cooled (−70° C.) charge-coupled device (CCD) camera. A Raman band of a silicon wafer at 520 cm$^{-1}$ was used to calibrate the spectrometer. All XP spectra were recorded on a ThermoVG SIGMA PROBE spectrometer using an Al$_{K\alpha}$ source operating at about 15 kV and about 70 W. A binding energy scale was calibrated to about 285 eV for the main C is peak. Each sample was analyzed at about 90° relative to an electron analyzer. Thicknesses of the polymer films were evaluated using an ellipsometer (AutoEL-II, Rudolph Research) and transmission electron microscopy (TEM; JEM2100F, JEOL). Current-voltage curves of the TFTs were measured by a semiconductor parameter analyzer (HP4155C, Agilent Technologies). Optical properties were measured by photoluminescence (PL) spectroscopy using a He—Cd laser (325 nm) in association with a spectrometer (Darsa, PSI Co. Ltd.).

Result

Figure 3A:
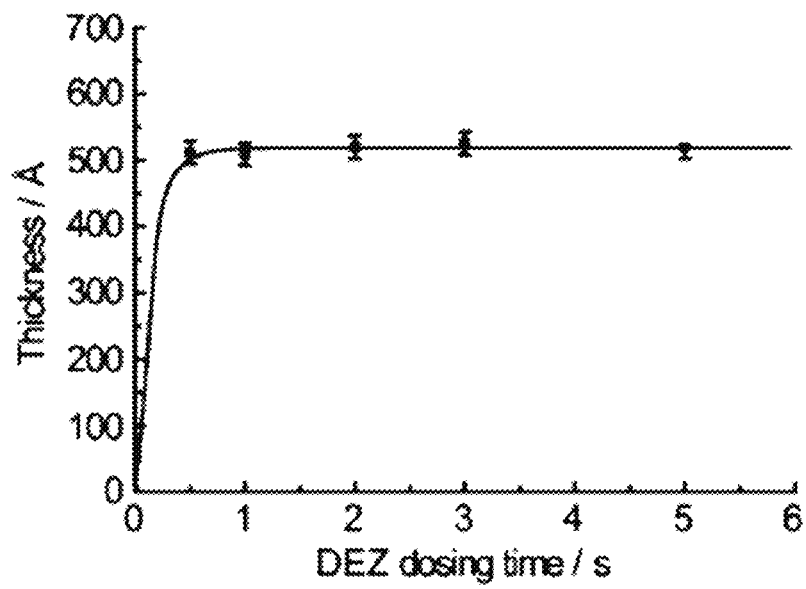
FIGS. 3A and 3B are a graph showing a thickness of a ZnOPDA film as (A) a function of a DEZ dosing time and (B) a function of a HDD dosing time in accordance with an example of the present disclosure.
Figure 3B:
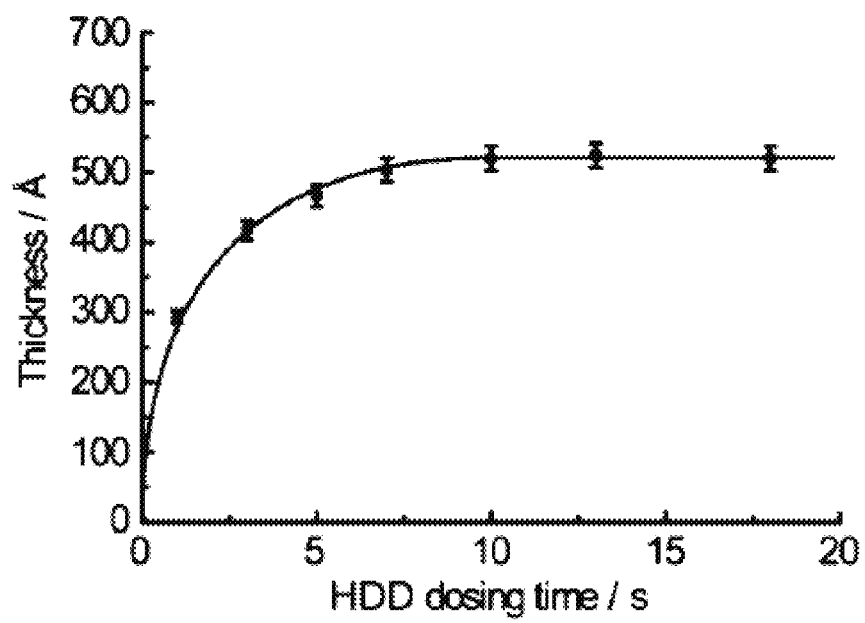

In an accurate MLD process, surface reactions needs to be self-terminating and complementary to yield a uniform, conformal, and high-quality polydiacetylene thin film. To verify that the surface reaction for HDD is self-terminating in deed, a dosing time was varied between about 1 second and about 20 seconds. A growth rate of the ZnOPDA films was measured by an ellipsometer at growth temperatures in a range of from about 100° C. to about 150° C. The obtained film thickness per cycle for HDD became saturated when the dosing time exceeded 10 seconds (FIG. 3B). This result indicates that HDD undergoes a self-terminating reaction with DEZ absorbed on Si substrates. FIG. 3A shows that the growth rate as a function of a DEZ dosing time was quickly saturated when a pulse time exceeded 0.5 seconds. This result suggests that DEZ undergoes a fast self-terminating reaction with HDD adsorbed on the substrates. All the self-terminating growth experiments were performed over 100 cycles. Saturation data indicate that DEZ and HDD fully react with active sites on the surfaces and that the reaction does not continue after saturation even though the precursors are present in excess.

Figure 4A:
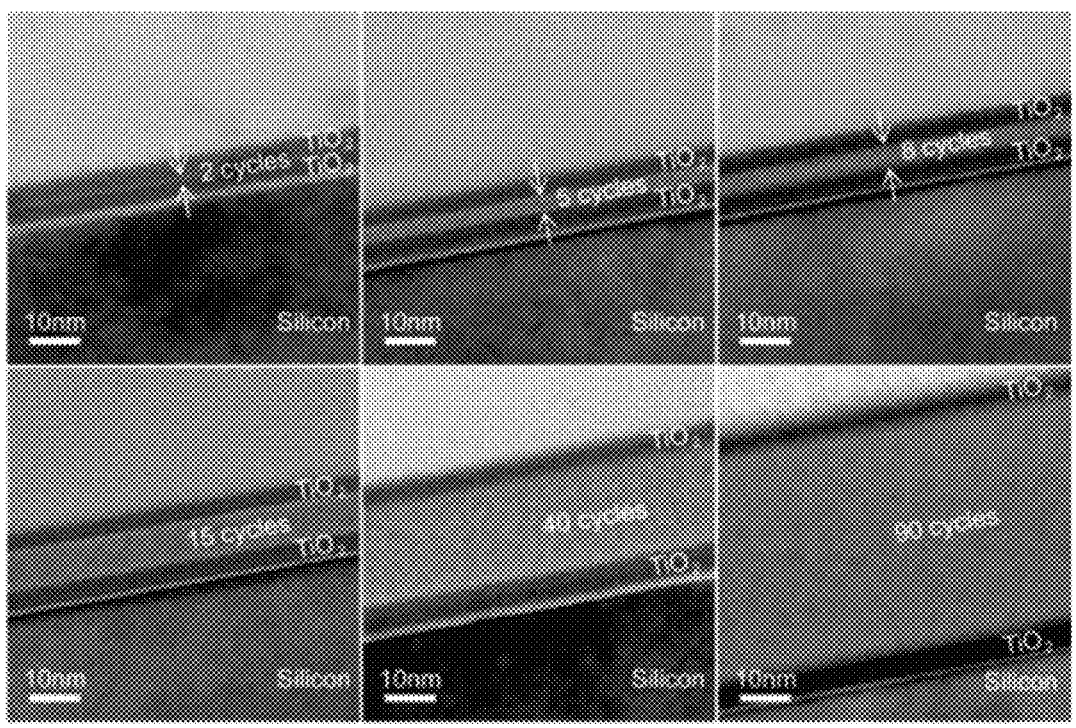
FIGS. 4A to 4C provide (A) TEM images of a ZnOPDA film, (B) a graph showing a relationship between a thickness of the ZnOPDA film and the number of MLD cycles, and (C) an AFM image of the ZnOPDA film in accordance with an example of the present disclosure.

Thicknesses of ZnOPDA thin films as a function of the number of MLD cycles were measured using cross-sectional transmission electron microscopy (TEM) (FIG. 4A). TiO$_2$ was added thereto in order to indicate a color.

Figure 4B:
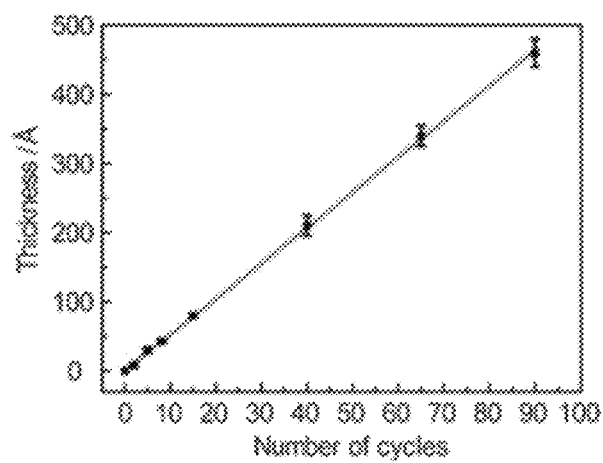
Figure 4C:
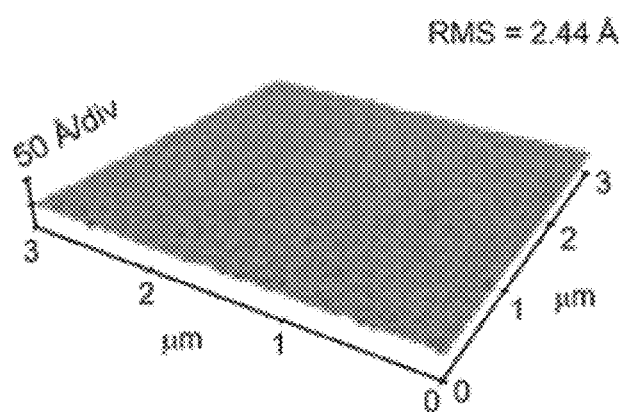

These TEM images confirmed expectations for a monolayer thickness in the ZnOPDA films and a growth rate of the MLD. FIG. 4B shows that a thickness of the polydiacetylene increases nearly linearly as the number of cycles increases, indicating that the surface reaction for this MLD process are complementary and complete. The measured growth rate was about 5.2 Å per cycle, which is consistent with results of the ellipsometer. The TEM images also show that the ZnOPDA films are amorphous and have no ZnO nanocrystals. AFM images of the ZnOPDA films showed very smooth and uniform surfaces, and a root mean square (RMS) roughness of the surfaces was as low as about 2.5 Å (FIG. 4C). In comparison, a surface roughness of an initial cleaned Si substrate was about 2.1 Å. Regardless of the cycle number, the surfaces of the ZnOPDA films were as smooth as the initial cleaned Si substrate, indicating that MLD growth occurs in a 2D fashion through layer-by-layer growth and the entire substrate was uniformly doped. These results suggest that the MLD of the 2D polydiacetylene is self-limiting and proceeds by layer-by-layer growth, and that the MLD conditions are sufficient for a complete reaction at temperatures ranging from about 100° C. to about 150° C.

A thermal stability of the ZnOPDA films was observed by using TEM. The ZnOPDA films were stable in air up to temperatures of about 400° C. This result, together with the stability of the 2D polydiacetylene to survive the TEM preparation process, confirms that polydiacetylene is covalently bonded by zinc oxide cross-linked layers.

Figure 5A:
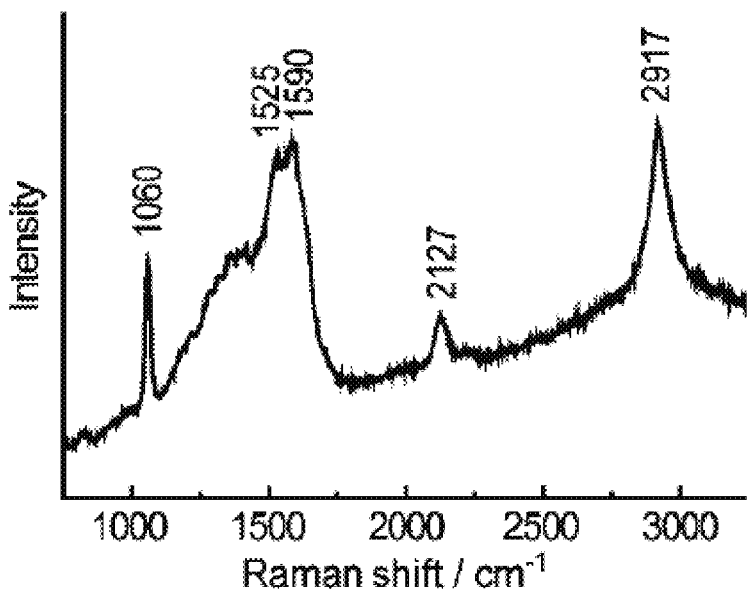
FIGS. 5A and 5B provide (A) Raman spectrum and (B) XP spectrum of a ZnOPDA film in accordance with an example of the present disclosure.

Surface-enhanced Raman scattering (SERS) spectroscopy was applied to confirm photopolymerization of diacetylene thin films. An Ag film of about 100 nm thick was deposited on a Si (100) substrate by a vacuum evaporator. A 2D polydiacetylene film of about 2 nm thick was then grown on the Ag film. Ag nanoparticles with a diameter of about 60 nm were dropped on the polydiacetylene surface under ambient conditions. FIG. 5A illustrates a representative SERS spectrum for the ZnOPDA films sandwiched between the Ag nanoparticles and the Ag film. Three Raman bands are clearly seen at $v_1$=2127 cm$^{-1}$, $v_2$=1525 cm$^{-1}$, and $v_3$=1060 cm$^{-1}$, which are in reasonably good agreement with previously observed Raman data for a polydiacetylene monolayer. A narrow band at about 2917 cm$^{-1}$ is due to C—H vibrations. Prominent and broad bands around 1590 cm$^{-1}$ and 1360 cm$^{-1}$ are similar to those observed upon irradiation of an excitation laser, which is interpreted to be a result of a conversion from polydiacetylenes into carbon materials including graphite and amorphous carbon. The SERS results indicate that diacetylene molecules in the films are polymerized by UV irradiation, which is in agreement with generally known photopolymerization of diacetylene.

Figure 5B:
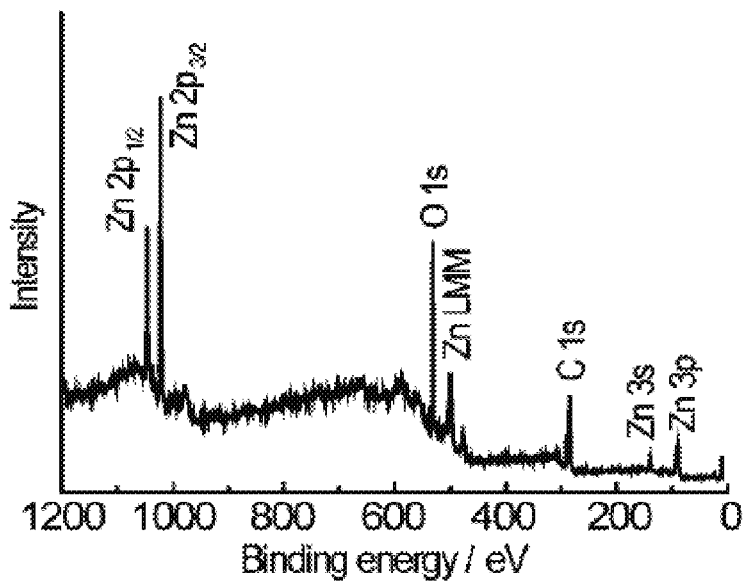

X-ray photoelectron (XP) spectroscopic studies were performed to determine composition of the ZnOPDA thin films grown by this MLD process. FIG. 5B shows a irradiation spectrum of a polydiacetylene thin film of about 100 nm thick grown on a Si substrate. An XP spectrum displays photoelectron and Auger electron peaks for zinc, oxygen, and carbon only. A peak area ratio for these elements, corrected by elemental sensitivity factors, was 1:3.2:5.8 (Zn:O:C). As a comparison, an expected ratio from a model structure of the 2D polydiacetylenes (FIG. 1) was 1:2:6. Thus, it was observed that the ratio of Zn:O:C in the present disclosure, i.e. 1:3.2:5.8, is very similar to an ideal ratio of Zn:O:C. A higher oxygen atomic percentage could be explained by adsorption of H$_2$O into the ZnOPDA films. The water exists mostly on the surface of the films since O is peak significantly decreases relatively to other peaks after Ar ion sputtering.

Figure 6:
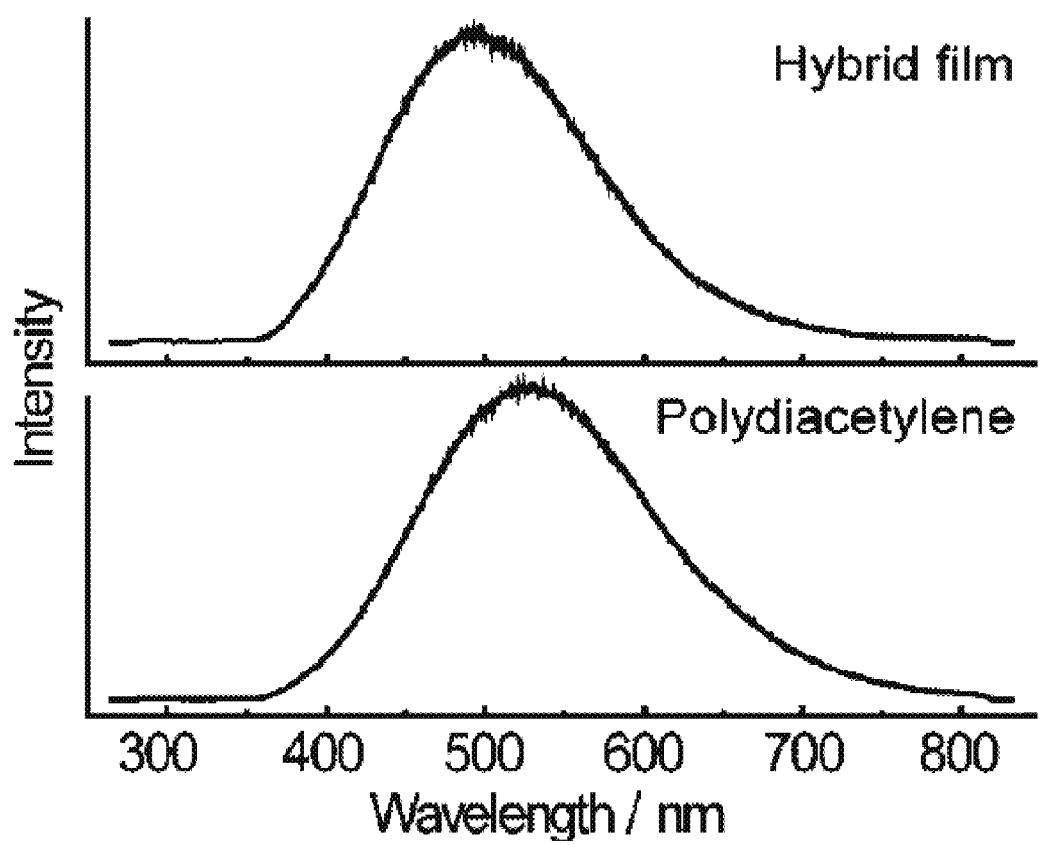
FIG. 6 shows photoluminescence spectra of a ZnOPDA film and a PDA film without an inorganic cross-linked layer in accordance with an example of the present disclosure.

A photoluminescence (PL) spectrum of the ZnOPDA thin film is shown in FIG. 6. For the PL spectrum, a He—Cd laser (λ=325 nm) as an excitation source was irradiated to the polydiacetylene film of about 100 nm thick deposited on the Si substrate. A broad peak near about 500 nm is shown in FIG. 6. The PL spectrum indicates a possibility of using ZnOPDA films in optical devices involving electroluminescence. For comparison, a polydiacetylene (PDA) thin film without inorganic cross-linked layers was also fabricated with a methanol solution of 2,4-hexadiyne-1,6-diol (HDD). A solution of about 6 mM HDD in methanol was spin coated on a Si substrate at about 1000 rpm for about 1 minute, and then the substrate was exposed to UV light for about 10 minutes to form a PDA Film of about 100 nm thick. The spectrum of the resulting film is very similar to that of ZnOPDA but is shifted slightly toward long wavelengths (FIG. 6). Thus, it was observed that the ZnOPDA film produced by the hybrid organic-inorganic thin film producing method in accordance with the present disclosure shows photoluminescence very similar to the polydiacetylene film.

Figure 7:
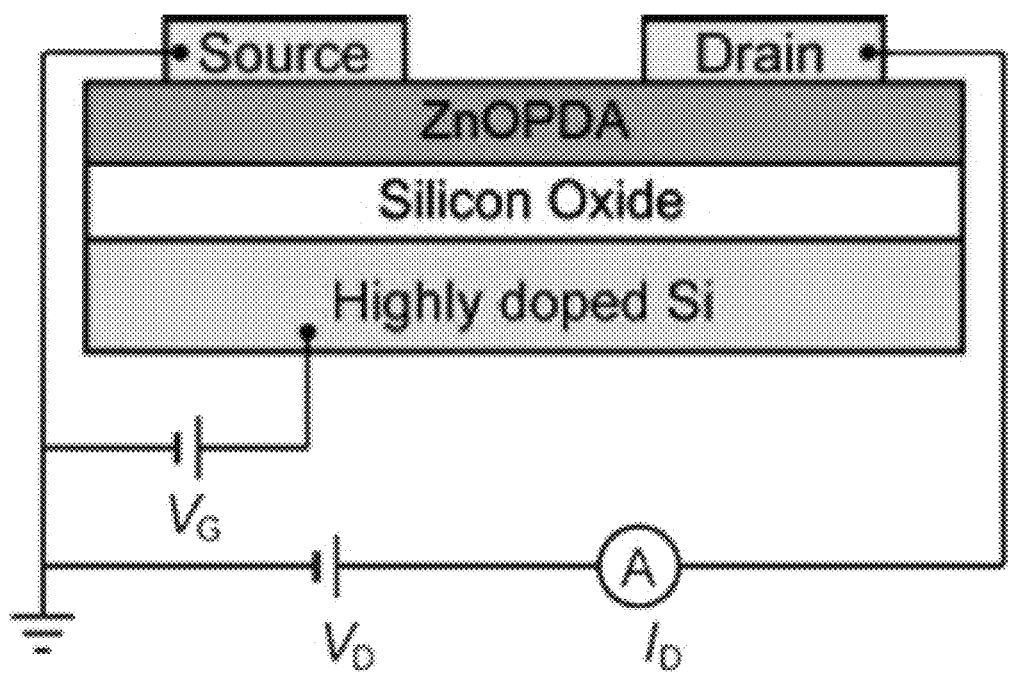
FIG. 7 is a cross-sectional view of a TFT with a an ZnOPDA active layer on a highly doped Si substrate in accordance with an example of the present disclosure.
Figure 8:
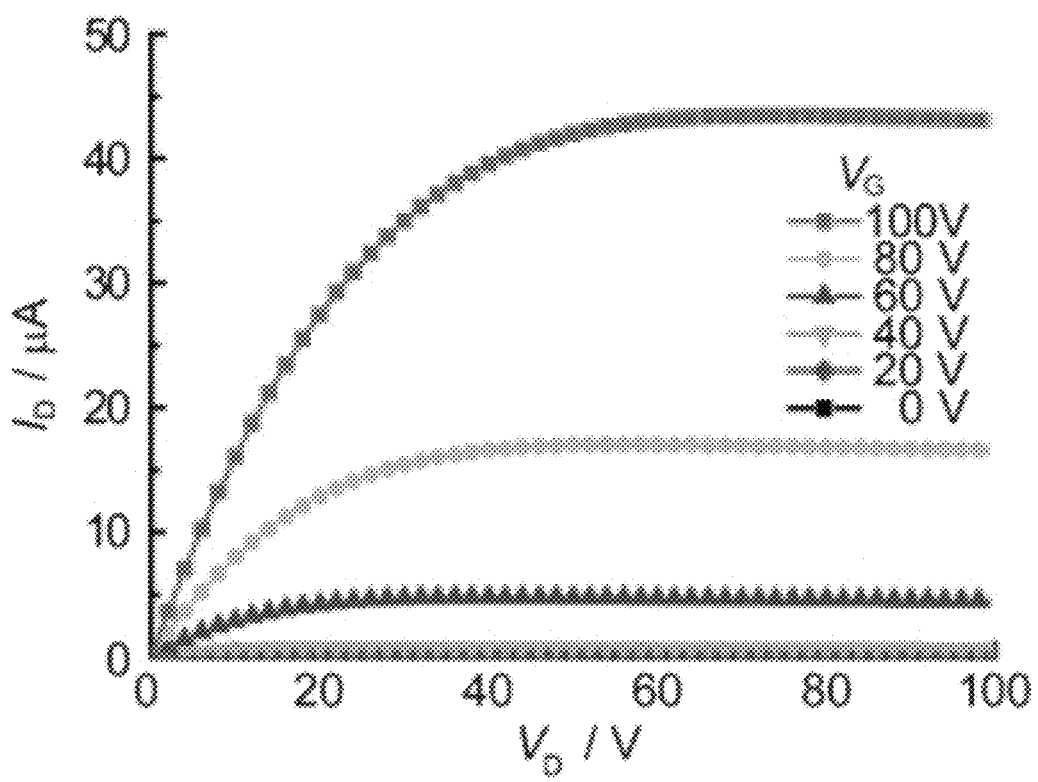
FIG. 8 is a graph showing drain current-drain voltage ($I_D$-$V_D$) output curves of TFTs in accordance with an example.
Figure 9:
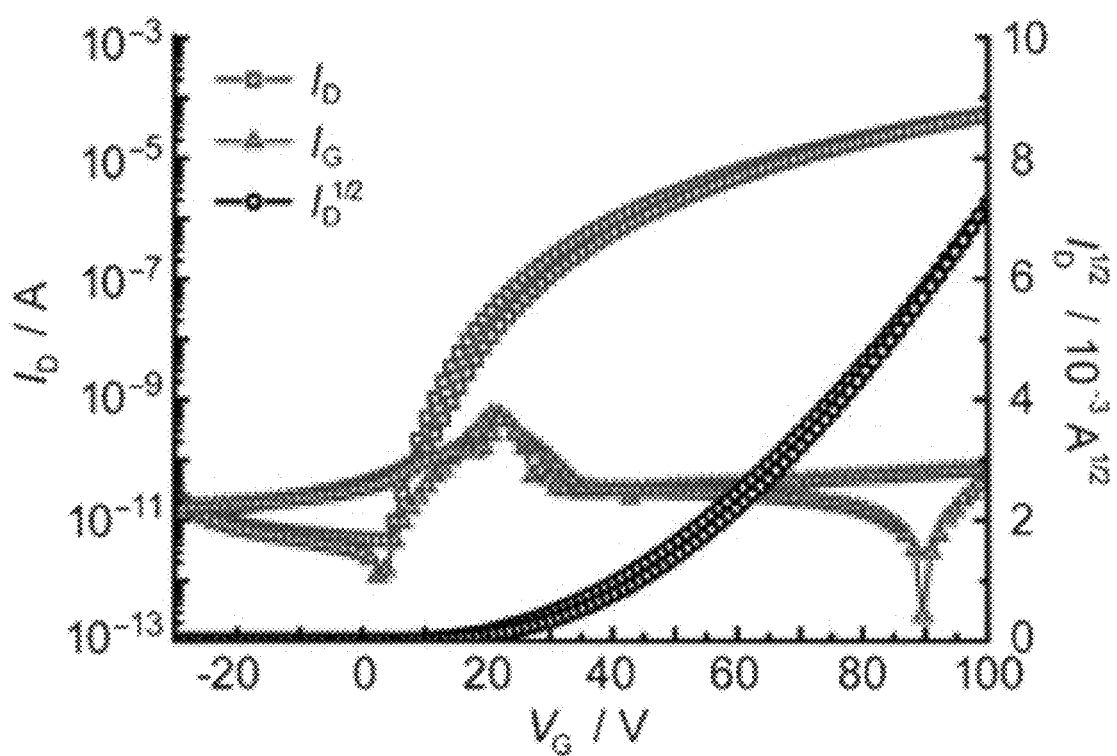
FIG. 9 is a graph showing drain current-gate voltage ($I_D$-$V_G$) transfer curves and gate leakage levels of TFTs in accordance with an example of the present disclosure.

To investigate electrical properties of the 2D polydiacetylene thin films, a thin film transistor (TFT) adopting a ZnOPDA film as an active layer was produced. The TFT had a ZnO-PDA semiconductor channel grown on a $SiO_2/n^+$-Si substrate of about 100 nm thick at about 100° C., as shown in the device in FIG. 7. Patterned Al source/drain electrodes were vapor-deposited on the ZnOPDA films using a shadow mask. As can be seen from FIG. 8, a typical output (drain current versus drain voltage: $I_D$-$V_D$) curve was obtained from the ZnOPDA TFT. The data indicate that ZnOPDA serves as an n-type semiconductor. The maximum $I_D$ level was around 40 μA under about 100 V gate bias. According to transfer characteristics ($I_D$-$V_G$) shown in FIG. 9, a high field effect electron mobility of greater than about $1.3\ cm^2V^{-1}s$ was achieved in a saturation regime of $V_D$=100 V along with an on/off ratio of greater than about $10^6$ and a threshold voltage of about 45 V. A gate leakage current ($I_G$) was about $10^{-10}$ A or less. The electron mobility obtained in this study is the highest among polydiacetylene-based TFTs. These ZnOPDA TFTs could increase an operation speed of flexible electronic devices. A TFT with a PDA of about 30 nm thick without cross-linked layers was also fabricated and showed much lower field-effect mobility ($<10^{-8}\ CM^2V^{-1}s$) than that of the ZnOPDA film.

In conclusion, two-dimensional polydiacetylene with inorganic cross-linked layers was developed by using MLD. The MLD process yields precision accurate control of film thickness, large-scale uniformity, excellent conformality, good reproducibility, and sharp interfaces at low temperatures. The fabricated ZnOPDA films exhibited good thermal and mechanical stabilities and an excellent field effect mobility ($>1.3\ cm^2V^{-1}s$). The MLD method is an ideal technique for producing various 2D organic polymer thin films with inorganic cross-linked layers and, furthermore, can be applied to production of organic polymer-inorganic hybrid superlattices.

Experimental Example 2

Study on Characteristic of TiOPDA Films of Example 2

An IR spectrum was obtained by using a FTIR spectrometer (FTLA 2000). 64 scans were performed to the spectrum with intervals of about 1 $cm^{-1}$. KBr powder (Sigma Aldrich) was ground finely by using a mortar and a pestle and then a KBr pellet is produced by using a compressor. In order to form a hydroxyl site on a surface of the produced pellet, $Al_2O_3$ was deposited thereon by using an ALD technique and then TiOPDA was produced in the same manner as described in the example 2. A UV-VIS spectrum of a TiOPDA film produced on a Quartz plate (JMC glass) in the same manner as described in the example 2 was obtained by using a UV-VIS spectrometer (Agilent 8453 UV-Vis). All XP spectra were recorded on a VG Scientific ESCALAB MK II spectrometer using a MgKa source operating at about 15 kV and about 70 W. A binding energy scale was calibrated to about 284.5 eV for the main C is peak. Each sample was analyzed at about 90° relative to an electron analyzer.

Result

Figure 10:
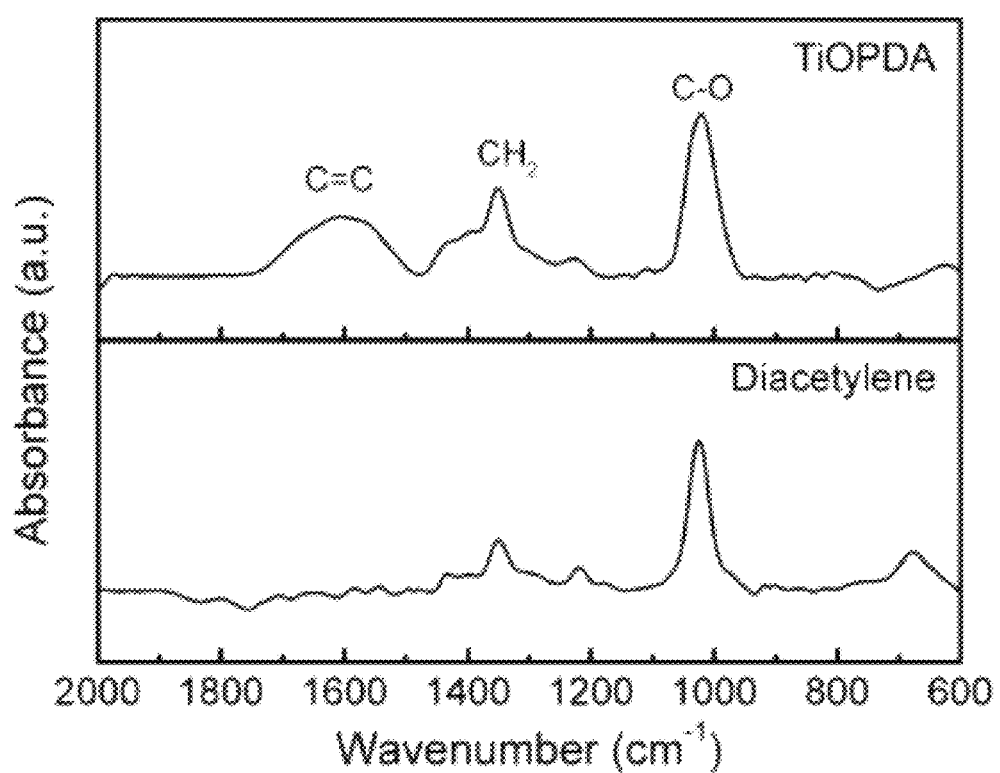
FIG. 10 shows an infrared spectroscopy spectrum of a TiOPDA film and a precursor in accordance with an example of the present disclosure.

FTIR spectroscopy was used to check a functional group of the TiOPDA thin film. FIG. 10 shows a spectrum of the produced TiOPDA thin film. For comparison, an IR spectrum of PDA was also analyzed. Peaks of a C—O bond and a $CH_2$ bond were shown at about 1000 $cm^{-1}$ and about 1350 $cm^{-1}$, respectively. A C=C stretching peak was shown at about 1600 $cm^{-1}$, which means that diacetylene was polymerized by UV irradiation.

Figure 11:
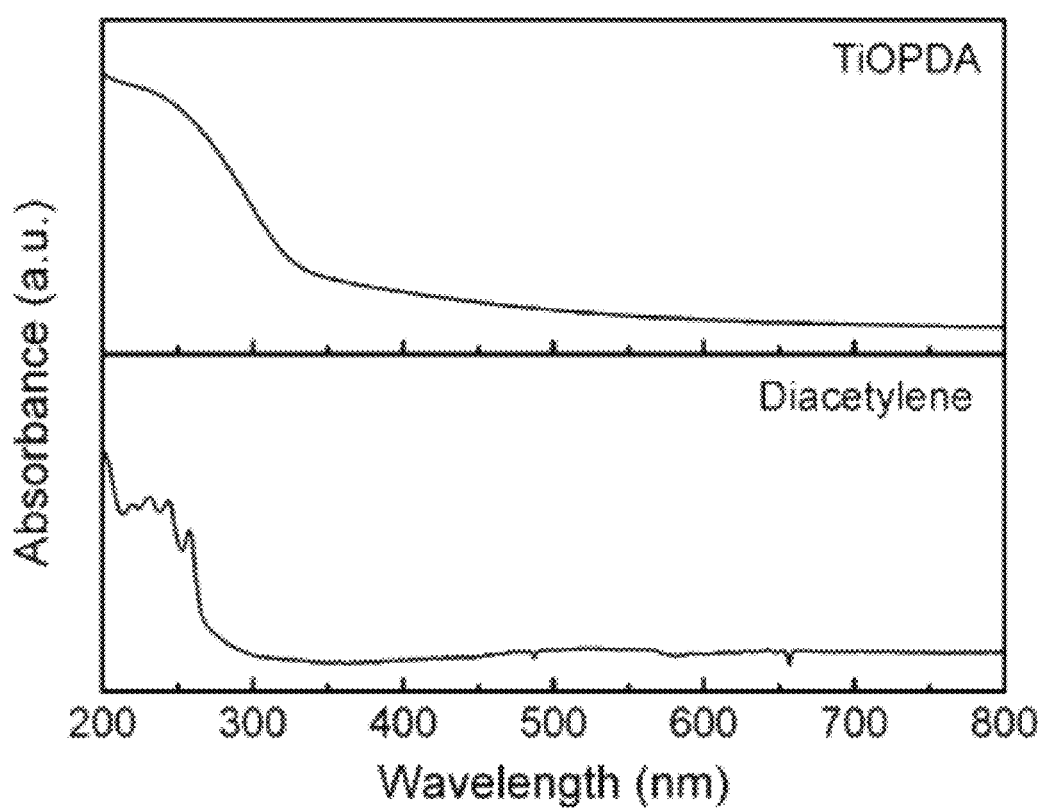
FIG. 11 shows a UV-VIS spectroscopy spectrum of a TiOPDA film and a precursor in accordance with an example of the present disclosure.

UV-ViS spectroscopy was used to optical characteristics of the TiOPDA thin film. FIG. 11 shows a UV-VIS spectroscopy spectrum of the TiOPDA film of about 50 nm thick grown on a quartz plate. In comparison with diacetylene, an adsorption peak of the TiOPDA thin film was shown in a wavelength range of from about 300 nm to about 400 nm.

Figure 12:
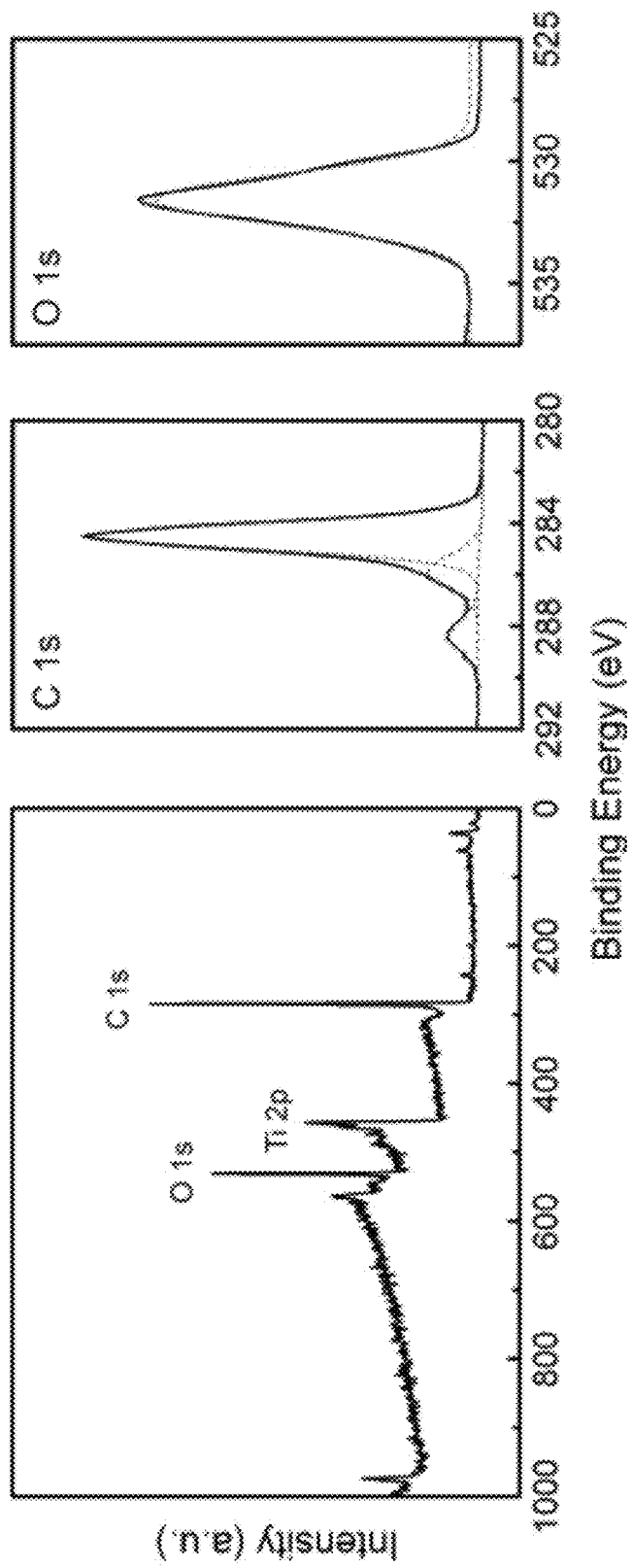
FIG. 12 shows XPS graphs of a TiOPDA film in accordance with an example of the present disclosure.

An X-ray photoelectron (XP) spectroscopic study was performed to determine a composition of the TiOPDA thin film grown by the MLD process. FIG. 12 shows a irradiation spectrum of the TiOPDA thin film of about 100 nm thick grown on a Si substrate. The XP spectrum displays photoelectron and Auger electron peaks for titanium, oxygen, and carbon only. The peak area ratio of these elements, corrected by elemental sensitivity factors, is 1:5.6:11.7 (Ti:O:C). As a comparison, an expected ratio from a model structure of the 2D polydiacetylenes (FIG. 2) was 1:4:12. It can be seen that the ratio of Ti:O:C, i.e. 1:5.6:11.7, of the present illustrative embodiment is very similar to a desirable ratio of Ti:O:C. A C is peak at about 284.5 eV represents conjugate-bonded carbon and peaks at about 286 eV and about 288.6 eV represent carbon bonded with oxygen.

The above description of the present disclosure is provided for the purpose of illustration, and it would be understood by those skilled in the art that various changes and modifications may be made without changing technical conception and essential features of the present disclosure. Thus, it is clear that the above-described embodiments and examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A producing method of a hybrid organic-inorganic thin film used for a semiconductor channel in a thin film transistor, comprising the step sequence of:
   (a)—bonding an inorganic cross-linked layer onto a substrate within a molecular layer deposition chamber; and
   (b)—bonding an organic monolayer to the inorganic cross-linked layer bonded onto the substrate and performing UV polymerization of the organic monolayer to form an organic polymer to have monolayer precision by ligand-exchange reactions of the inorganic crosslinked layer and the organic polymer;
   wherein the steps (a) and (b) use the molecular layer deposition and the step sequence is performed one or more times;

wherein the hybrid organic-inorganic thin film of the thin film transistor has a field effect mobility of from about 1.2 $cm^2 v^{-1}$ to about 1.7 $cm^2 v^{-1}$;

wherein the inorganic cross-linked layer contains an oxide of metal selected from the group including Zn, Sn, Mn, Fe, Ni, Mo, and combinations thereof, and wherein the organic polymer includes polydiacetylene or vinyl ether-aleimide.

2. The producing method of claim 1 further comprising, bonding hexadiyne diol (HDD) to the inorganic cross-linked layer bonded onto the substrate and performing UV polymerization thereto.

3. The producing method of claim 1, wherein the hybrid organic-inorganic thin film has a two-dimensional structure.

4. The producing method of claim 2, further comprising: a self-terminating reaction when the hexadiyne diol is bonded to the inorganic crosslinked layer bonded onto the substrate.

5. The producing method of claim 2, further comprising: a purging process after the inorganic cross-linked layer is bonded onto the substrate.

6. The producing method of claim 2, further comprising: a purging process after the hexadiyne diol is bonded to the inorganic cross-linked layer bonded onto the substrate.

7. The producing method of claim 5, wherein the purging process uses a purge gas including argon, nitrogen, or helium.

8. The producing method of claim 6, wherein the purging process uses a purge gas including argon, nitrogen or helium.

* * * * *